United States Patent
Lee et al.

(10) Patent No.: US 11,574,964 B2
(45) Date of Patent: Feb. 7, 2023

(54) DISPLAY PANEL

(71) Applicant: Samsung Display Co., Ltd., Yongin-si (KR)

(72) Inventors: Kyunghee Lee, Suwon-si (KR); Mihwa Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 221 days.

(21) Appl. No.: 17/156,614

(22) Filed: Jan. 24, 2021

(65) Prior Publication Data

US 2021/0343794 A1 Nov. 4, 2021

(30) Foreign Application Priority Data

Apr. 29, 2020 (KR) .................... 10-2020-0052775

(51) Int. Cl.
*H01L 27/32* (2006.01)

(52) U.S. Cl.
CPC ........ *H01L 27/322* (2013.01); *H01L 27/3244* (2013.01)

(58) Field of Classification Search
CPC ...... H01L 27/322; H01L 27/3244; G02B 5/23
See application file for complete search history.

(56) References Cited

U.S. PATENT DOCUMENTS

| 7,273,659 | B2 | 9/2007 | Garcia |
| 2018/0097045 | A1* | 4/2018 | Maeda .................... H01L 51/56 |
| 2019/0093008 | A1 | 3/2019 | Shin et al. |
| 2020/0037258 | A1 | 1/2020 | Tang |

FOREIGN PATENT DOCUMENTS

| JP | 4729719 | | 7/2011 | |
| KR | 10-2007-0033320 | | 3/2007 | |
| KR | 10-2015-0069364 | | 6/2015 | |
| KR | 10-2016-0014873 | | 2/2016 | |
| KR | 20180079017 | A * | 7/2018 | |
| KR | 10-1932221 | | 12/2018 | |
| KR | 10-1975350 | | 5/2019 | |
| KR | 10-2019-0135515 | | 12/2019 | |
| KR | 20200082920 | A * | 7/2020 | |
| WO | WO-2013044371 | A1 * | 4/2013 | ........... C07D 277/22 |

* cited by examiner

*Primary Examiner* — Mariceli Santiago
(74) *Attorney, Agent, or Firm* — H.C. Park & Associates, PLC

(57) ABSTRACT

According to one aspect of the invention, a display panel, includes: a first layer; a light control member disposed on the first layer, the light control member including a light converting element to initiate a change in wavelength of a first light to be emitted from the first layer; and a filter disposed on the light control member, the filter including a photochromic compound having a conjugation bond reversibly elongatable by absorbable light in a wavelength region of the first light to allow selective transmission of light in a wavelength region of about 480 nm or longer.

20 Claims, 7 Drawing Sheets

First Structure ⇌ Second Structure

DISPLAY PANEL

CROSS-REFERENCE TO RELATED APPLICATION

This application claims priority from and the benefit of Korean Patent Application No. 10-2020-0052775, filed on Apr. 29, 2020, which is hereby incorporated by reference for all purposes as if fully set forth herein.

BACKGROUND

Field

Exemplary implementations of the invention relate generally to a display panel, and more specifically, to a display panel including a filter layer containing a photochromic compound whose structure is changed depending on the wavelength of incident light.

Discussion of the Background

Various display devices are being developed for use in multimedia devices such as televisions, mobile phones, tablet computers, navigation systems, gaming machines, and the like. Such a display device includes a display panel having self-luminescent type light-emitting elements, which are used to display an image.

To produce a clear color image, the display device should be manufactured to have high color purity for each of red, green, and blue colors. In order to increase the color purity characteristics of the display device, many studies are being conducted on materials allowing for selective absorption or transmission of light in a specific wavelength.

The above information disclosed in this Background section is only for understanding of the background of the inventive concepts, and, therefore, it may contain information that does not constitute prior art.

SUMMARY

Display panels constructed according to the principles and exemplary implementations of the invention have a filter layer that may include a photochromic compound, whose structure is changed to selectively transmit light of a specific wavelength when light from an emission element layer is incident upon the photochromic compound, thereby suppressing light leakage and improving the color purity characteristics of the display panel.

Additional features of the inventive concepts will be set forth in the description which follows, and in part will be apparent from the description, or may be learned by practice of the inventive concepts.

According to one aspect of the invention, a display panel, includes: a first layer; a light control member disposed on the first layer, the light control member including a light converting element to initiate a change in wavelength of a first light to be emitted from the first layer; and a filter disposed on the light control member, the filter including a photochromic compound having a conjugation bond reversibly elongatable by absorbable light in a wavelength region of the first light to allow selective transmission of light in a wavelength region of about 480 nm or longer.

The light control member may include a light control layer including a first light controller, a second light controller, and a third light controller, which may be spaced apart from each other, the second light controller may include a first light converting element to convert the first light to a green light, and the third light controller may include a second light converting element to convert the first light to a red light.

The first layer may include an emission element layer and the filter may include a filter layer including: a first filter portion overlapped with the first light controller including a first light control unit; and a second filter portion overlapped with the second and third light controllers including second and third light control units, wherein the second filter portion may include the photochromic compound.

The second filter portion may include: a first sub-filter portion overlapped with the second light control unit; and a second sub-filter portion overlapped with the third light control unit, wherein the first and second sub-filter portions may be spaced apart from each other.

The photochromic compound may include at least one of spiropyran, spirooxazine, diarylethene, azobenzene, hexaarylbiimidazole, or spiroperimidine.

According to another aspect of the invention, a display panel, includes: a first layer to emit a first light when activated; a light control member disposed on the first layer, the light control member including a first light controller to transmit the first light, a second light controller to convert the first light to a second light, and a third light controller to convert the first light to a third light, the second and third lights having wavelengths longer than that of the first light wavelength and different from each other; and a filter disposed on the light control member, the filter including a photochromic compound, wherein the photochromic compound includes a conjugation bond reversibly elongatable when absorbing light in a wavelength region of the first light, and to selectively transmit light in a wavelength region of about 480 nm or longer.

The photochromic compound may include a first structure having a first conjugation bond when deactivated, and may include a second structure having a second conjugation bond with a longer bond length than the first conjugation bond when activated.

The filter may include the photochromic compound of the first structure to transmit light in a whole visible wavelength range, and the filter having the photochromic compound of the second structure to selectively transmit light in a wavelength region of about 480 nm or longer.

The second structure may be made from a ring-closing reaction of a ring included in the first structure.

The chemical structure of the photochromic compound may be reversible between the first structure and the second structure, depending on whether or not the photochromic compound receives the first light.

The photochromic compound may include at least one of spiropyran, spirooxazine, diarylethene, azobenzene, hexaarylbiimidazole, or spiroperimidine.

The filter may include a filter member including: a first filter portion overlapped with the first light controller having a first light control unit; and a second filter portion overlapped with the second and third light controllers having second and third control units, wherein the second filter portion may include the photochromic compound.

The first filter portion may be configured to transmit the first light, and the second filter portion may be configured to selectively transmit light in a wavelength region of about 480 nm or longer.

The second filter portion may include: a first sub-filter portion overlapped with the second light control unit; and a second sub-filter portion overlapped with the third light control unit, wherein the first sub-filter portion and the second sub-filter portion may be spaced apart from each other.

An upper substrate may be disposed on the filter.

The first light may be a blue light.

The first layer may include an emission element layer including a plurality of emission element layers stacked in a thickness direction.

According to a further aspect of the invention, a display panel, includes: an emission element layer to emit a first light when activated; a light control member disposed on the emission element layer, the light control member including a first light controller to transmit the first light, a second light controller to convert the first light to a second light, and a third light controller to convert the first light to a third light, the second and third lights having wavelengths longer than that of the first light wavelength and different from each other; and a filter disposed on the light control member, the filter including a photochromic compound, wherein the photochromic compound includes: a first photochromic compound having a first structure to transmit light in a whole visible wavelength range when deactivated, and having a second structure to block a blue light and to transmit a green light when activated; and a second photochromic compound having a third structure to transmit light in the whole visible wavelength range when deactivated, and having a fourth structure to block the blue light and to transmit a red light when activated.

The filter may include a filter layer including: a first filter portion overlapped with the first light controller having a first light control unit to transmit a first light; a second filter portion overlapped with the second light controller having a second light control unit, the second filter portion having the first photochromic compound; and a third filter portion overlapped with the third light controller having a third light control unit, the third filter portion having the second photochromic compound, wherein the first to third filter portions may be spaced apart from each other.

The photochromic compound may include at least one of spiropyran, spirooxazine, diarylethene, azobenzene, hexaarylbiimidazole, or spiroperimidine.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
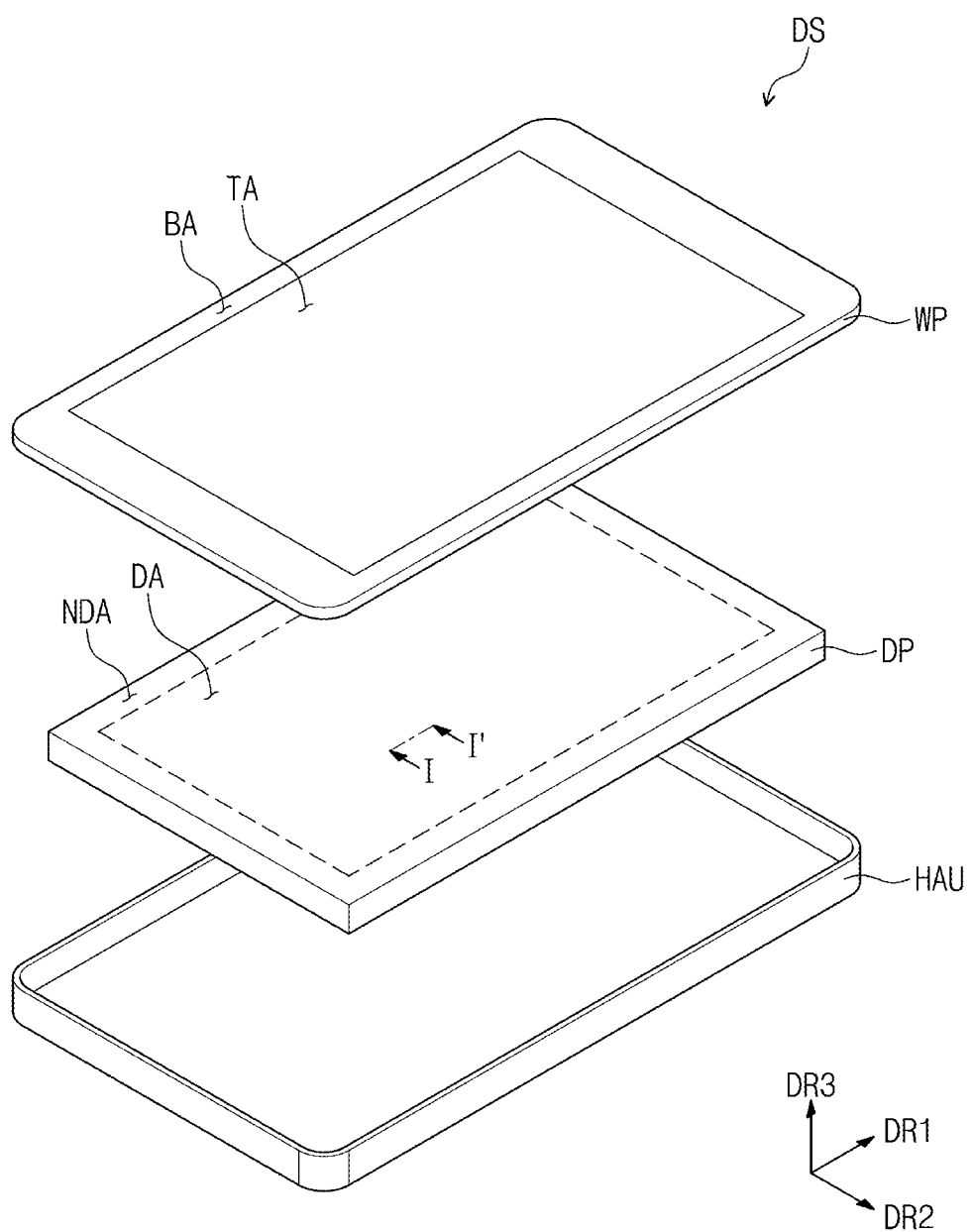
FIG. 1 is an exploded perspective view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. For example, the relative thicknesses and positioning of molecules, layers, regions and/or structural elements may be reduced or exaggerated for clarity. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is an exploded perspective view illustrating an exemplary embodiment of a display device constructed according to principles of the invention.

A first direction axis DR1, a second direction axis DR2, and a third direction axis DR3 are illustrated in the drawings, but as used herein, the direction axes may be just relative concept. For convenience in description, the direction of the third direction axis DR3 may be defined as a propagation direction of an image light to be provided to a user. In addition, the first and second direction axes DR1 and DR2 may be perpendicular to each other, and the third direction axis DR3 may be a direction normal to a plane defined by the first and second direction axes DR1 and DR2. In FIG. 1, the plane defined by the first and second direction axes DR1 and DR2 may be a display surface, on which an image is displayed.

In some exemplary embodiments, the display device DS may include a window WP, a display panel DP, and an external case HAU, and, in the display device DS, the window WP may be disposed on the display panel DP. The window WP may be formed of or include at least one of glass or plastic materials. The window WP may include a transmission region TA, which allows an image light provided from the display panel DP to pass therethrough, and a bezel region BA, which is adjacent to the transmission region TA.

The transmission region TA may be disposed at a center region of the display device DS, when viewed in a plan view parallel to the first and second direction axes DR1 and DR2. The bezel region BA may be disposed around the transmission region TA and may have a generally frame shape surrounding the transmission region TA. However, the exemplary embodiments are not limited to this example, and in some exemplary embodiments, the window WP may have only the transmission region TA, without the bezel region BA. In some exemplary embodiments, the bezel region BA may be locally disposed near at least one of edge or side regions of the transmission region TA.

In some exemplary embodiments, the window WP may be omitted from the display device DS, unlike that shown in FIG. 1. When viewed in a plan view, the display panel DP may include a surface, which is used to display an image and is defined as a display surface. The display surface may include a display region DA, which is used to display the image, and a non-display region NDA, which is not used to display the image. When viewed in a plan view, the display region DA may be defined at the center region of the display panel DP and may be overlapped with the transmission region TA of the window WP.

The external case HAU may be disposed to cover the display panel DP such that a top surface, which is the display surface of the display panel DP, is exposed to the outside. For example, the external case HAU may cover side and bottom surfaces of the display panel DP, but the entire top surface of the display panel DP may be exposed to the outside.

Figure 2:
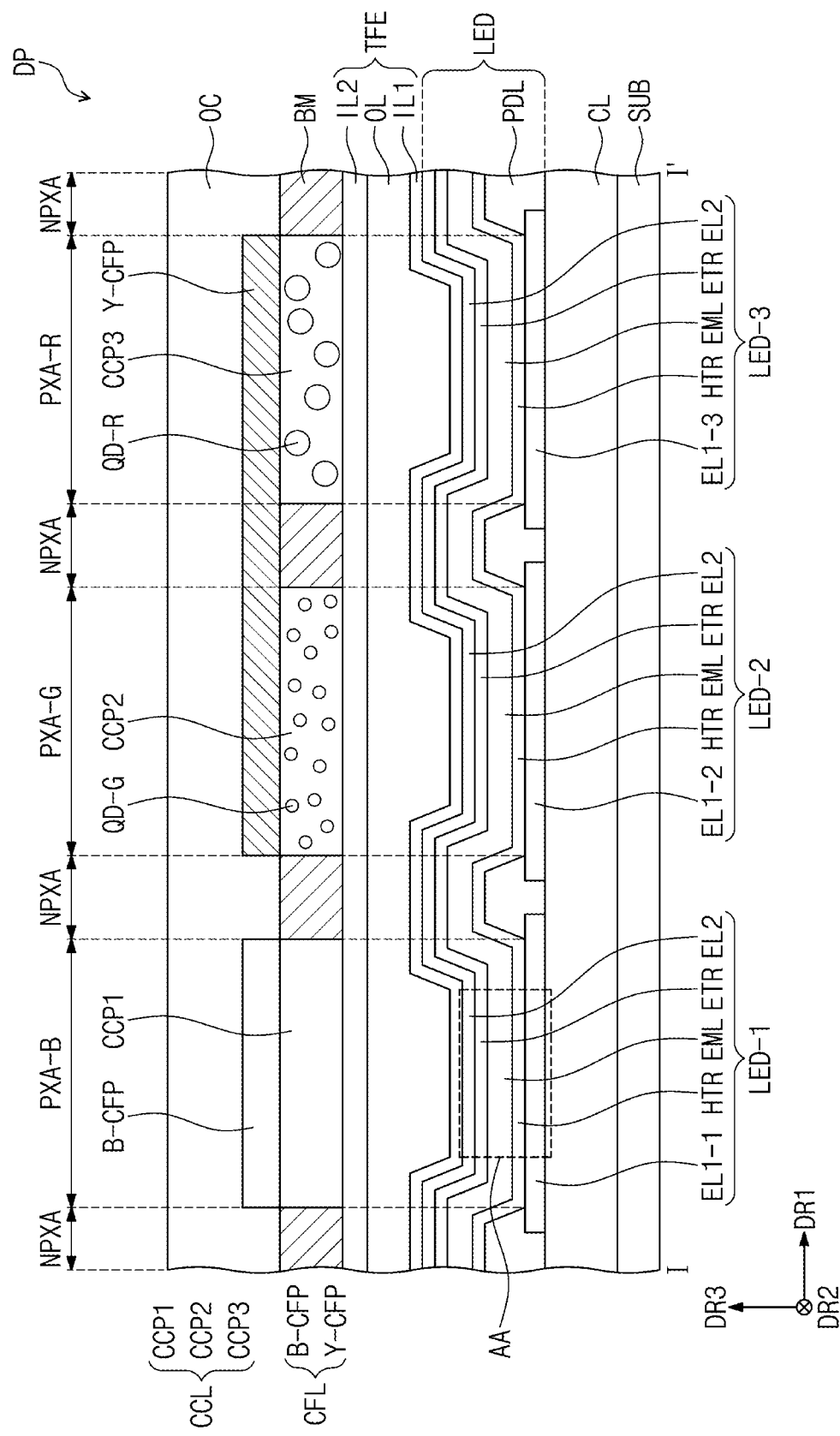
FIG. 2 is a cross-sectional view taken along line I-I' of FIG. 1 illustrating an exemplary embodiment of a portion of the display panel.
Figure 3:
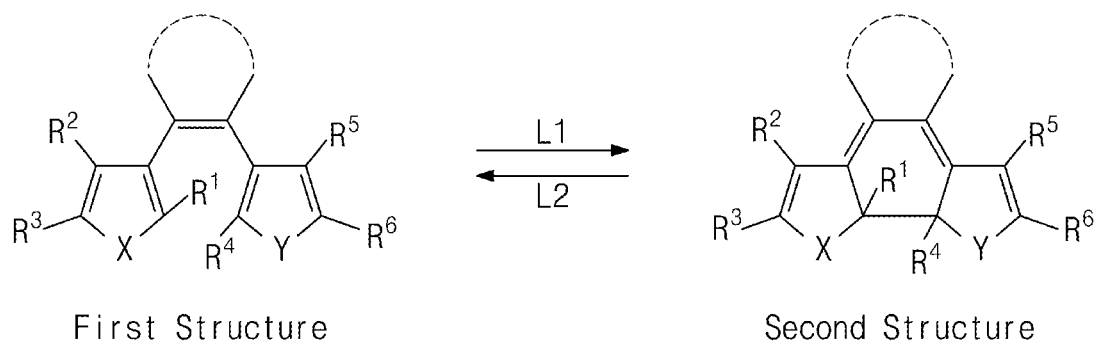
FIG. 3 is a schematic diagram illustrating a structural change in an exemplary embodiment of a photochromic compound included in a display panel constructed according to principles of the invention.
Figure 4:
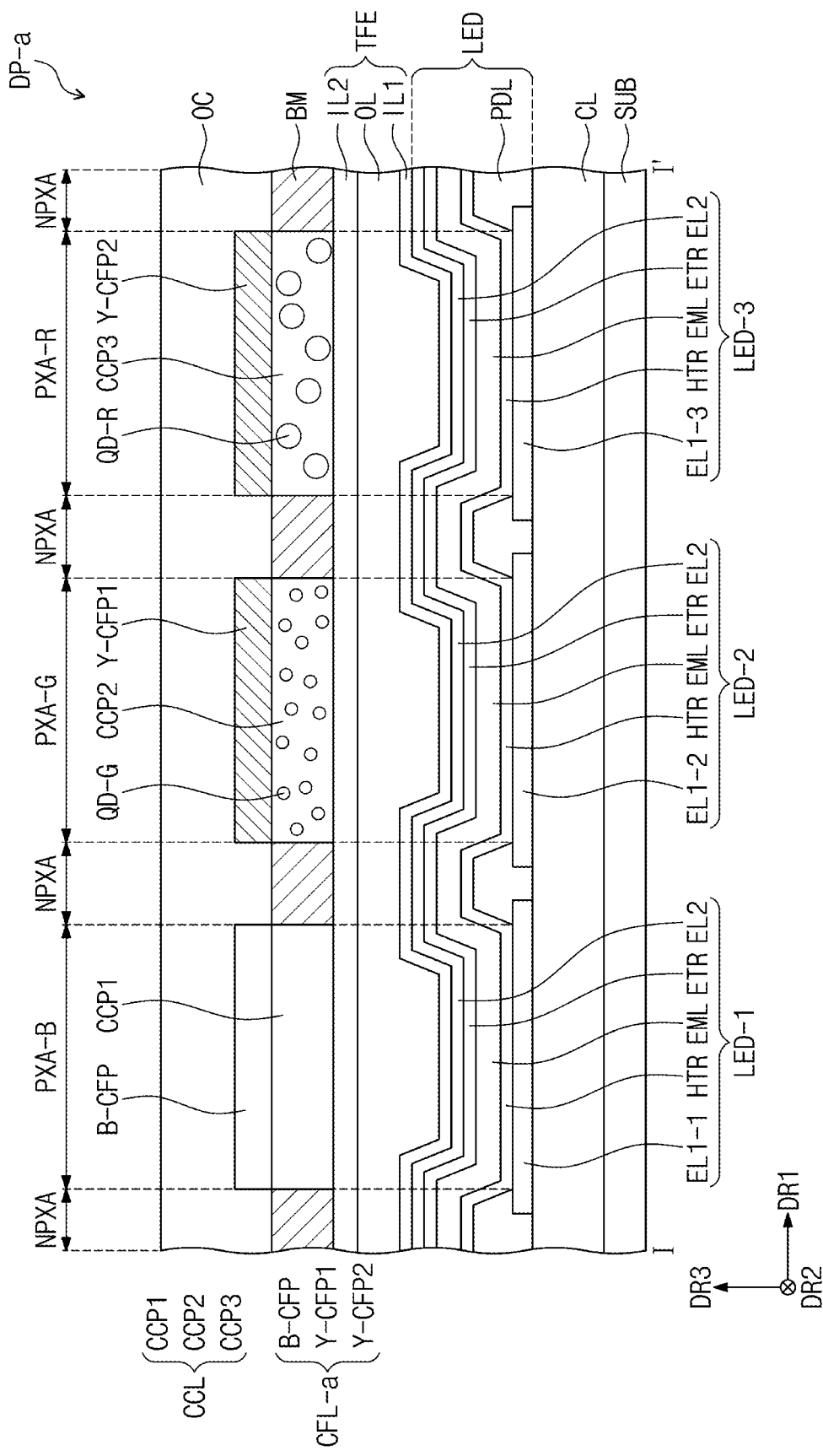
FIG. 4 is a cross-sectional view taken along the line I-I' of FIG. 1 illustrating another exemplary embodiment of the portion of the display panel constructed according to principles of the invention.
Figure 5:
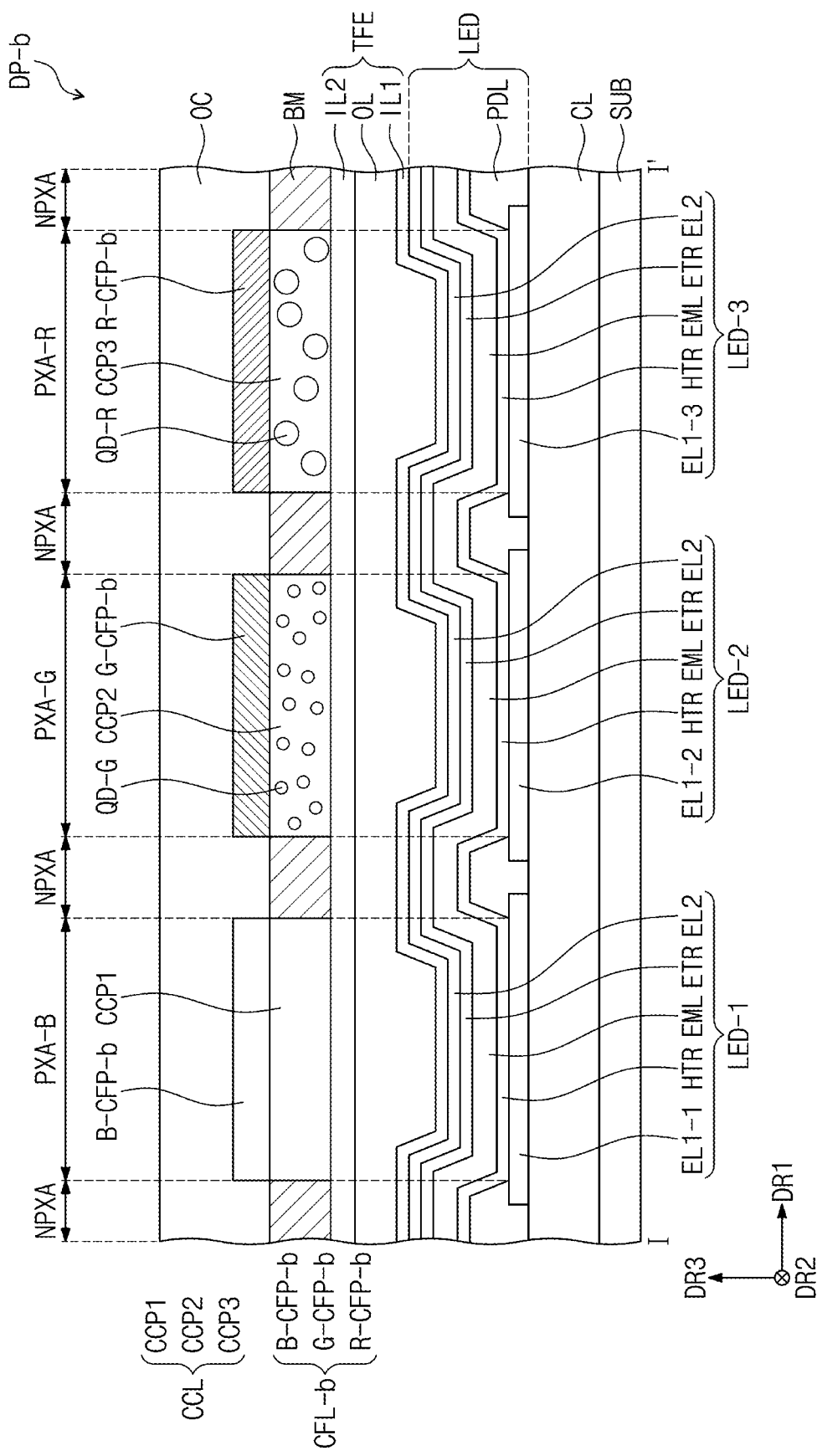
FIG. 5 is a cross-sectional view taken along the line I-I' of FIG. 1 illustrating a further exemplary embodiment of the portion of the display panel constructed according to principles of the invention.
Figure 6:
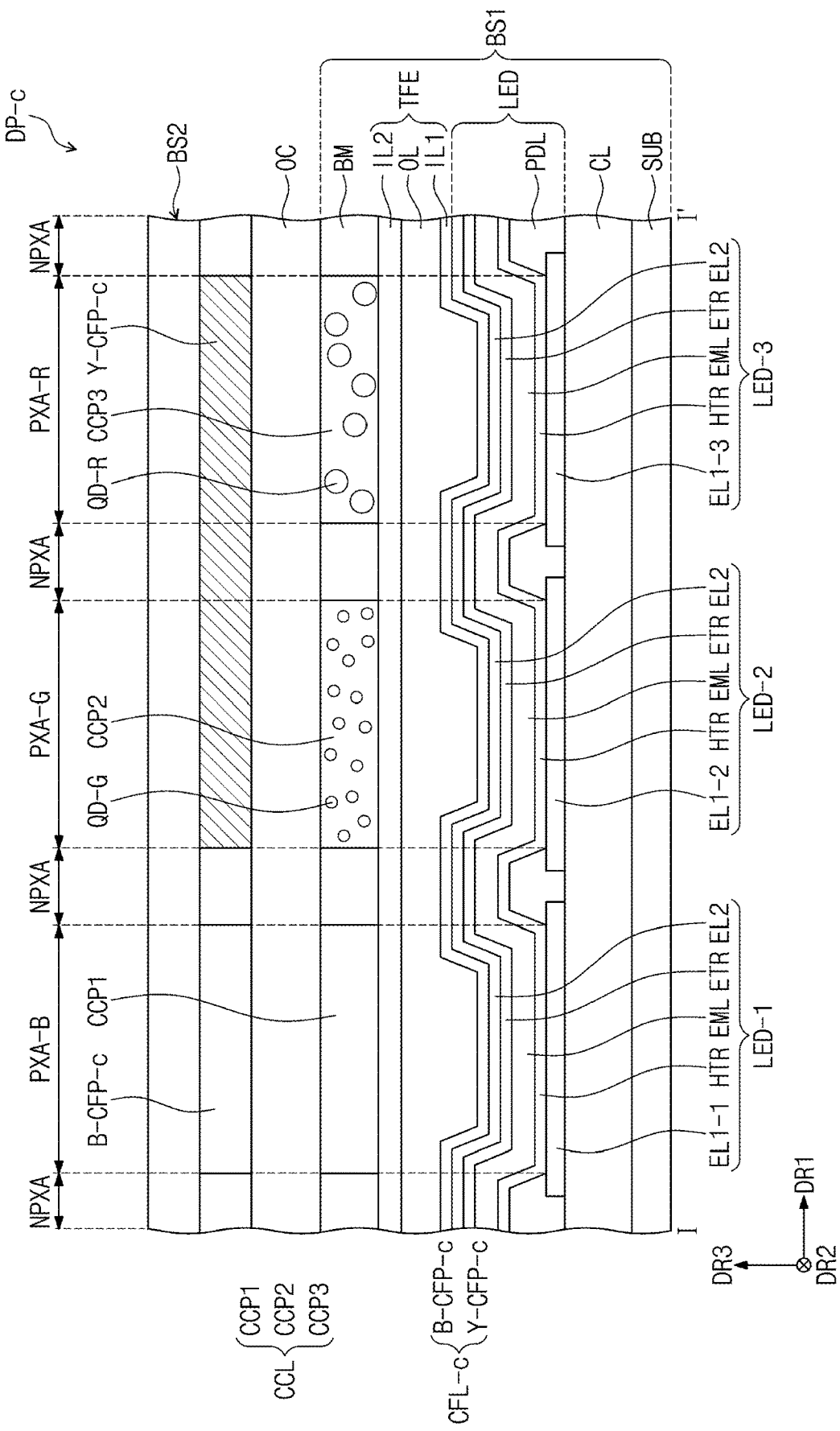
FIG. 6 is a cross-sectional view taken along the line I-I' of FIG. 1 illustrating still another exemplary embodiment of the portion of the display panel constructed according to principles of the invention.

FIG. 2 is a cross-sectional view taken along line I-I' of FIG. 1 illustrating an exemplary embodiment of a portion of the display panel. FIG. 3 is a schematic diagram illustrating a structural change in an exemplary embodiment of a photochromic compound included in a display panel constructed according to principles of the invention. FIG. 4 is a cross-sectional view taken along the line I-I' of FIG. 1 illustrating another exemplary embodiment of the portion of the display panel constructed according to principles of the invention. FIG. 5 is a cross-sectional view taken along the line I-I' of FIG. 1 illustrating a further exemplary embodiment of the portion of the display panel constructed according to principles of the invention. FIG. 6 is a cross-sectional view taken along the line I-I' of FIG. 1 illustrating still another exemplary embodiment of the portion of the display panel constructed according to principles of the invention.

Referring to FIG. 2, the display panel DP may include a non-light-emitting region NPXA and light-emitting regions PXA-R, PXA-G, and PXA-B. In some exemplary embodiments, the display panel DP may include three light-emitting regions PXA-R, PXA-G, and PXA-B, which are configured to emit red, green, and blue lights, respectively. Areas of the light-emitting regions PXA-R, PXA-G, and PXA-B may be equal to or different from each other, when viewed in a plan view. The plan view for measuring the area may be selected to be parallel to the first and second direction axes DR1 and DR2.

Referring to FIG. 2, the display panel DP may include a base substrate SUB, a circuit layer CL disposed on the base substrate SUB, a first layer in the form of an emission element layer LED disposed on the circuit layer CL, an encapsulation layer TFE disposed on the emission element layer LED, a light control member, which may be in the form of a light control layer CCL, disposed on the encapsulation layer TFE, a filter, which may be in the form of a filter layer CFL, disposed on the light control layer CCL, and an over-coat layer OC disposed on the filter layer CFL.

The base substrate SUB may be a polymer substrate, a plastic substrate, a glass substrate, a quartz substrate, or the like. In some exemplary embodiments, the base substrate SUB may be a transparent insulating substrate. The base substrate SUB may be substantially rigid or substantially flexible.

The circuit layer CL may include a plurality of transistors. Each of the transistors may include a control electrode, an input electrode, an output electrode, and so forth. In some exemplary embodiments, the circuit layer CL may include switching and driving transistors, which are used to operate emission elements LED-1, LED-2, and LED-3 of the emission element layer LED to be described below.

The emission element layer LED may include first to third emission elements LED-1, LED-2, and LED-3. Each of the emission elements LED-1, LED-2, and LED-3 may be delimited by a pixel definition layer PDL. In some exemplary embodiments, the first emission elements LED-1 may be overlapped with the red light-emitting regions PXA-R, the second emission elements LED-2 may be overlapped with the green light-emitting regions PXA-G, and the third emission elements LED-3 may be overlapped with the blue light-emitting regions PXA-B.

Each of the first to third emission elements LED-1, LED-2, and LED-3 may include a first electrode EL1-1, EL1-2, or EL1-3, a hole transport region HTR, an emission layer EML, an electron transport region ETR, and a second electrode EL2, which are sequentially stacked. The emission layer EML may be provided as a unitary member extending throughout the first to third emission elements LED-1, LED-2, and LED-3 and may be disposed in not only the light-emitting regions PXA-R, PXA-G, and PXA-B but also the non-light-emitting region NPXA. The emission layer EML may be configured to emit a first light. For example, the first light may be a blue light. In some exemplary embodiments, the emission element layer LED may generate light within a wavelength region of about 410 to about 480 nm.

The light-emitting regions PXA-R, PXA-G, and PXA-B and the non-light-emitting region NPXA may be delimited by the pixel definition layer PDL. For example, the pixel definition layer PDL may define the positions and shapes of the light-emitting regions PXA-R, PXA-G, and PXA-B. The non-light-emitting regions NPXA may be regions of the display panel DP corresponding to the pixel definition layer PDL. The pixel definition layer PDL may be formed of or include a polymer resin. For example, the pixel definition layer PDL may be formed to include polyacrylate resins or polyimide resins. The pixel definition layer PDL may be formed of a material containing a black pigment or a black dye.

The encapsulation layer TFE may be disposed on the emission element layer LED to hermetically seal the emission element layer LED. The encapsulation layer TFE may be used to protect the emission element layer LED from moisture, oxygen, or a contamination material (e.g., dust particles). The encapsulation layer TFE may have a structure including inorganic layers IL1 and IL2 and an organic layer OL. For example, as shown in FIG. 2, the encapsulation layer TFE may include a first inorganic layer ILL an organic layer OL disposed on the first inorganic layer ILL and a second inorganic layer IL2 disposed on the organic layer OL. However, the exemplary embodiments are not limited to this example, and the encapsulation layer TFE may further include at least one inorganic layer and/or at least one organic layer, in addition to the first inorganic layer ILL the organic layer OL, and the second inorganic layer IL2 shown in FIG. 2.

The light control layer CCL may be disposed on the encapsulation layer TFE. The light control layer CCL may include light converting elements QD-R and QD-G, which are used to change the wavelength of the first light emitted from the emission element layer LED. The light converting elements QD-R and QD-G may include a first light converting element QD-G converting the first light to a green light and a second light converting element QD-R converting the first light to a red light.

In some exemplary embodiments, the light control layer CCL may include light control units CCP2 and CCP3, in which the light converting elements QD-R and QD-G are provided. In some exemplary embodiments, the light converting elements QD-R and QD-G may be or include quantum dots.

In some exemplary embodiments, the emission layer may be formed of or include a material including quantum dots. The core of the quantum dot may be selected from the group consisting of II-VI compounds, III-V compounds, IV-VI compounds, IV elements, IV compounds, and combinations thereof.

The II-VI compounds may be selected from the group consisting of binary compounds (e.g., CdSe, CdTe, CdS, ZnS, ZnSe, ZnTe, ZnO, HgS, HgSe, HgTe, MgSe, and MgS), mixtures of the binary compounds, ternary compounds (e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-VI compounds may include binary compounds (e.g., $In_2S_3$ and $In_2Se_3$), ternary compounds (e.g., $InGaS_3$ and $InGaSe_3$), or combinations thereof.

The compounds may be selected from the group consisting of ternary compounds (e.g., AgInS, $AgInS_2$, CuInS, $CuInS_2$, $AgGaS_2$, $CuGaS_2$, $CuGaO_2$, $AgGaO_2$, and $AgAlO_2$), mixtures of the ternary compounds, quaternary compounds (e.g., $AgInGaS_2$ and $CuInGaS_2$), and mixtures of the quaternary compounds.

The III-V compounds may be selected from the group consisting of binary compounds (e.g., GaN, GaP, GaAs, GaSb, AlN, AlP, AlAs, AlSb, InN, InP, InAs, and InSb), mixtures of the binary compounds, ternary compounds (e.g., GaNP, GaNAs, GaNSb, GaPAs, GaPSb, AlNP, AlNAs, AlNSb, AlPAs, AlPSb, InGaP, InAlP, InNP, InNAs, InNSb, InPAs, and InPSb), mixtures of the ternary compounds, quaternary compounds (e.g., GaAlNP, GaAlNAs, GaAlNSb, GaAlPAs, GaAlPSb, GaInNP, GaInNAs, GaInNSb, GaInPAs, GaInPSb, InAlNAs, InAlNSb, InAlPAs, and InAlPSb), and mixtures of the quaternary compounds. In some exemplary embodiments, the III-V compounds may further include one of the group II metals. For example, InZnP or the like may be selected as such a III-II-V compound.

The IV-VI compounds may be selected from the group consisting of binary compounds (e.g., SnS, SnSe, SnTe, PbS, PbSe, and PbTe), mixtures of the binary compounds, ternary compounds (e.g., SnSeS, SnSeTe, SnSTe, PbSeS, PbSeTe, PbSTe, SnPbS, SnPbSe, and SnPbTe), mixtures of the ternary compounds, quaternary compounds (e.g., SnPbSSe, SnPbSeTe, and SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

Here, the binary, ternary, or quaternary compound may have a uniform concentration throughout the particle or may have a spatially varying concentration distribution in each particle. In certain exemplary embodiments, each of the quantum dots may have a core/shell structure, in which one quantum dot is enclosed by another quantum dot. An element contained in the shell may have a concentration gradient decreasing in a direction from an interface between the core and the shell toward a center of the shell.

In some exemplary embodiments, the quantum dot may have a core-shell structure, which includes a core, which contains the afore-described nanometer-order crystalline material, and a shell surrounding the core. The shell of the quantum dot may be used as a protection layer, which prevents chemical characteristics of the core from being changed and preserves the semiconductor property of the core, and/or may be used as a charging layer, which allows the quantum dot to have an electrophoretic property. The shell may have a single- or multi-layered structure. An element contained in the shell may have a concentration gradient decreasing in a direction from an interface between the core and the shell toward a center of the shell. For example, the shell of the quantum dot may be formed of or include oxide compounds of metallic or nonmetallic elements, semiconductor compounds, or any combination thereof.

For example, the oxide compounds of metallic or nonmetallic elements may include binary compounds (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO) and ternary compounds (e.g., $MgAl_2O_4$, $CoFe_2O_4$, $NiFe_2O_4$, and $CoMn_2O_4$), but the exemplary embodiments are not limited to these examples.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and so forth, but the exemplary embodiments are not limited to these examples.

Each of the quantum dots may have a light-emitting wavelength spectrum whose full width half maximum (FWHM) is less than about 45 nm (in particular, less than about 40 nm or in more particular, less than about 30 nm), and in this case, it may be possible to realize improved color purity or color reproduction characteristics. Furthermore, because the quantum dots emit light in all directions, it may be possible to improve a viewing angle property.

In some exemplary embodiments, the quantum dots may be a generally spherical shaped, a generally pyramid-shaped, a generally multi-arm shaped, or a generally cubic nano shaped particle. In another exemplary embodiment, the quantum dots may be a generally-shaped nano tube, a generally-shaped nano wire, a generally-shaped nano fiber, a nano generally plate-shaped particle, but the exemplary embodiments are not limited to these examples.

The wavelength or color of light emitted from the quantum dot may be determined by a particle size of the quantum dot, and thus, by providing quantum dots of various sizes, it may be possible to realize various colors (e.g., blue, red, and green).

The light control layer CCL may include a first light control unit CCP1 transmitting the first light, a second light control unit CCP2 including the first light converting element QD-G, and a third light control unit CCP3 including the second light converting element QD-R. The first light control unit CCP1 may be formed of a transparent resin, and in some exemplary embodiments, the first light control unit CCP1 may further include a blue pigment or dye. The first light control unit CCP1 may be configured to transmit the first light, which is emitted from the emission element layer LED. In some exemplary embodiments, the first light control unit CCP1 may be configured to transmit not only the first light, but also an ultraviolet or a visible light.

The second light control unit CCP2 may be configured to convert the first light, which is emitted from the emission element layer LED, to a second light, and the third light control unit CCP3 may be disposed to convert the first light, which is emitted from the emission element layer LED, to a third light. As described above, the emission element layer LED may be configured to emit a blue light serving as the first light. The second light converted by the second light control unit CCP2 may be a green light, and the third light converted by the third light control unit CCP3 may be a red light. In other words, the first light control unit CCP1 may transmit the blue light, the second light control unit CCP2 may convert the blue light to the green light, and the third light control unit CCP3 may convert the blue light to the red light.

The light control units CCP1, CCP2, and CPP3 may be spaced apart from each other, and a light-blocking portion BM may be disposed between the light control units CCP1, CCP2, and CPP3. The light-blocking portion BM may contain a black pigment or a black dye. The light-blocking portion BM may prevent a light leakage phenomenon and may delimit the light control units CCP1, CCP2, and CPP3 adjacent to each other.

In some exemplary embodiments, the filter layer CFL may include filter portions B-CFP and Y-CFP. The filter layer CFL may be disposed on the light control layer CCL and may contain a photochromic compound. The photochromic compound may include a conjugation bond, which is reversibly elongated by absorbing light within a wavelength region of the first light, and the elongation of the conjugation bond may lead to a change in color of the photochromic compound, thereby allowing for transmission of light within a wavelength region of about 450 nm or longer. In some exemplary embodiments, the first light may be a blue light. In certain exemplary embodiments, the first light may include an ultraviolet light.

The light control layer CCL may include a first filter portion B-CFP corresponding to the first light control unit CCP1 and a second filter portion Y-CFP corresponding to the second and third light control units CCP2 and CCP3. The second filter portion Y-CFP may be provided as a single object overlapped with both of the second and third light control units CCP2 and CCP3. The first filter portion B-CFP may transmit the blue light but may block the green light and the red light. In addition, the second filter portion Y-CFP may transmit the green light and the red light but may block the blue light.

In some exemplary embodiments, the second filter portion Y-CFP of the filter layer CFL may contain the photochromic compound. In some exemplary embodiments, the first filter portion B-CFP of the filter layer CFL may not contain the photochromic compound, and only the second filter portion Y-CFP may contain the photochromic compound. If the blue light is incident into the photochromic compound, the chemical structure of the photochromic compound may be changed to transmit only light having a wavelength of about 450 nm or longer. The photochromic compound may have a first structure allowing for transmission of light in the whole visible wavelength range, when the emission element layer LED is deactivated, and may have a second structure allowing for transmission of only the light having a wavelength of about 450 nm or longer, when the emission element layer LED is activated. When the emission element layer LED is activated, the first light may be emitted and may be incident upon the photochromic compound. As used herein, when the emission element layer LED is activated, the emission elements LED-1, LED-2, and LED-3 of the emission element layer LED may be configured to emit the first light in response to a driving signal provided from the circuit layer CL. When deactivated, no light is emitted from the emission element layer LED.

A portion of the first light, which is emitted from the emission element layer LED and is provided to the second and third light control units CCP2 and CCP3, may pass through the second and third light control units CCP2 and CCP3 and thus may not be used to excite the light converting elements QD-R and QD-G and to emit the second or third light. The first light passing through the second and third light control units CCP2 and CCP3 may be mixed with the second or third light, and in this case, the color purity characteristics of the display device DS may be deteriorated. According to some exemplary embodiments, since the filter layer CFL contains the photochromic compound, which absorbs the first light provided from the light control layer CCL and allows selectively transmission of light with a specific wavelength, it may be possible to reduce light leakage and thereby improve the color purity characteristics of the display panel.

Referring to FIG. 3, a compound, which is contained in the filter layer CFL, may have a conjugation bond. For example, the photochromic compound of the first structure may have a first conjugation bond, and the photochromic compound of the second structure may have a second conjugation bond longer than the first conjugation bond. However, the exemplary embodiments are not limited to this example, and any photochromic compound having a first structure allowing for transmission of light in the whole visible wavelength range when the emission element layer LED is deactivated and a second structure allowing for selective transmission of light of about 480 nm or longer when the emission element layer LED is activated, may be used for the filter layer CFL.

The photochromic compound may be changed to a second structure having a second conjugation bond, which is longer than the first conjugation bond, through a ring-closing reaction of a ring included in the first structure having the first conjugation bond. However, the exemplary embodiments are not limited to this example, and if the photochromic compound can be changed from the first structure to the second structure, the exemplary embodiments are not limited to the kind of the reaction causing the change in structure of the photochromic compound. That is, any other kind of reaction may be possible if the photochromic compound of the second structure has a conjugation bond longer than that in the photochromic compound of the first structure. For example, the reaction changing the structure of the photochromic compound from the first structure to the second structure may be a reaction that changes a trans structure to a cis structure when the first light is incident to the photochromic compound.

The structural change of the photochromic compound from the first structure to the second structure may be reversible. For example, if the first light is irradiated to the photochromic compound of the first structure, the photochromic compound may be changed to the second structure, due to the ring-closing reaction in a ring of the first structure, and if a visible light is irradiated to the photochromic compound of the second structure, the photochromic compound may be changed to the first structure, due to the ring-opening reaction in the ring of the photochromic compound. In FIG. 3, a first light L1 may be ultraviolet light, and a second light L2 may be visible light.

The second filter portion Y-CFP may be formed of or include at least one photochromic compound of spiropyran, spirooxazine, diarylethene, azobenzene, hexaarylbiimidazole, and spiroperimidine.

The over-coat layer OC may be disposed on the filter layer CFL. The over-coat layer OC may be a planarization layer. For example, in the case where the filter portions B-CFP and Y-CFP of the filter layer CFL may have top surfaces at different levels, the over-coat layer OC may be provided for the planarization. In addition, the over-coat layer OC may be used to protect the elements thereunder.

Hereinafter, display panels according to some exemplary embodiments will be described in more detail with reference to FIGS. 4 to 6. In the following description, an element previously described with reference to FIGS. 1 to 3 may be identified by the same reference number without repeating a repetitive description thereof, for the sake of brevity.

Referring to FIG. 4, in a display panel DP-a according to some exemplary embodiments, a filter layer CFL-a has second filter portions, which may be first and second sub-filter portions Y-CFP1 and Y-CFP2, that are respectively overlapped with the second light control unit CCP2 and the third light control unit CCP3 and are spaced apart from each other when viewed in a plan view, which may be substantially parallel to the first and second direction axes DR1 and DR2.

The display panel DP-b of FIG. 5 may include a filter layer CFL-b, which is different from the filter layer CFL in the display panel DP of FIG. 2. In detail, referring to FIG. 5, a filter layer CFL-b may include a first filter portion B-CFP-b corresponding to the first light control unit CCP1, a second filter portion G-CFP-b corresponding to the second light control unit CCP2, and a third filter portion R-CFP-b corresponding to the third light control unit CCP3. The first filter portion B-CFP-b may be configured to have substantially the same features as the first filter portion B-CFP of FIG. 2, and a repetitive description thereof will be omitted for the sake of brevity.

In the display panel DP-b, the filter layer CFL-b may contain a photochromic compound. In some exemplary embodiments, the photochromic compound may contain a first photochromic compound and a second photochromic compound. First photochromic compound may have a first structure allowing for transmission of light in the whole visible wavelength range, when the emission element layer LED is deactivated, and a second structure blocking the blue light and allowing for transmission of the green light, when the emission element layer LED is activated. The second photochromic compound may have a third structure allowing for transmission of light in the whole visible wavelength range, when the emission element layer LED is deactivated, and a fourth structure blocking the blue light and allowing transmission of the red light, when the emission element layer LED is activated. The first and second structures may be the same as those in FIG. 3, and a relationship between the third and fourth structures may be similar to that between the first and second structures. For example, a conjugation length of the fourth structure may be longer than a conjugation length of the third structure.

The first photochromic compound and the second photochromic compound may be different from each other. For example, the first photochromic compound and the second photochromic compound may have the first structure and the third structure which are different from each other, until the first light is incident thereto, but may have the second structure and the fourth structure which transmit lights in different wavelength regions, after the incidence of the first light.

The first filter portion B-CFP-b overlapped with the first light control unit CCP1 may transmit the first light, the second filter portion G-CFP-b overlapped with the second light control unit CCP2 may contain the first photochromic compound, and the third filter portion R-CFP-b overlapped with the third light control unit CCP3 may contain the second photochromic compound. The first to third filter portions B-CFP-b, G-CFP-b, and R-CFP-b may be spaced apart from each other, when viewed in a plan view.

FIG. 6 illustrates a display panel DP-c according to some exemplary embodiments. In the following description of the display panel DP-c, the same element in the display panel DP or the photochromic compound previously described with reference to FIGS. 2 and 3 may be identified by the same reference number without repeating the description thereof for the sake of brevity.

In some exemplary embodiments, the display panel DP-c may further include a lower substrate BS1 and an upper substrate BS2 provided on a filter layer CFL-c. The upper substrate BS2 may be an element disposed on the filter layer CFL-c. The upper substrate BS2 may serve as a supporter, on which the filter layer CFL-c is placed. The upper substrate BS2 may be a polymer substrate, a plastic substrate, a glass substrate, a quartz substrate, or the like. The upper substrate BS2 may be a transparent insulating substrate. The upper substrate BS2 may be substantially rigid or substantially flexible.

Figure 7:
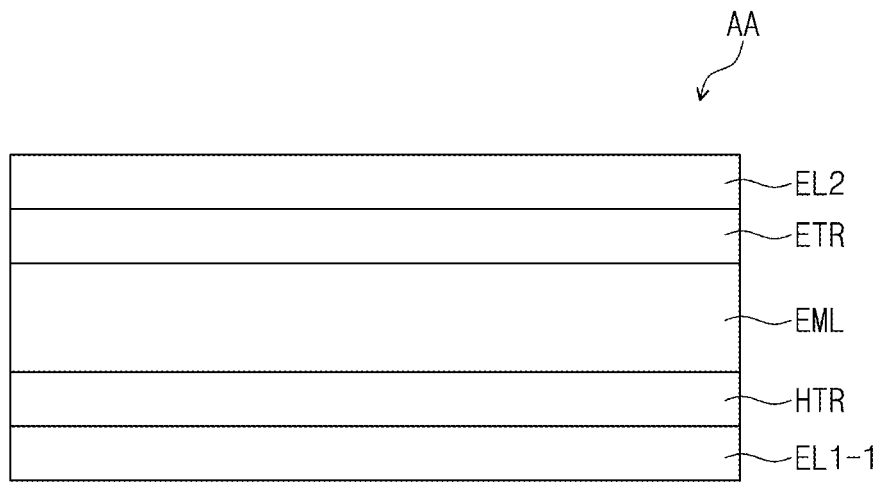
FIG. 7 is an enlarged cross-sectional view of FIG. 3 illustrating an exemplary embodiment of a portion of an emission element layer constructed according to principles of the invention.

FIG. 7 is an enlarged cross-sectional view of FIG. 3 illustrating an exemplary embodiment of a portion of an emission element layer constructed according to principles of the invention. For example, FIG. 7 is an enlarged sectional view illustrating a portion "AA" of the display panel DP of FIG. 2. Referring to FIG. 7, the emission element LED-1 may include a first electrode EL1-1, the hole transport region HTR, the emission layer EML, the electron transport region ETR, and the second electrode EL2. The emission element LED-1 may further include a capping layer provided on the second electrode EL2. In some exemplary embodiments, the emission element LED-1 may include a single emission layer EML interposed between the first electrode EL1-1 and the second electrode EL2.

Figure 8:
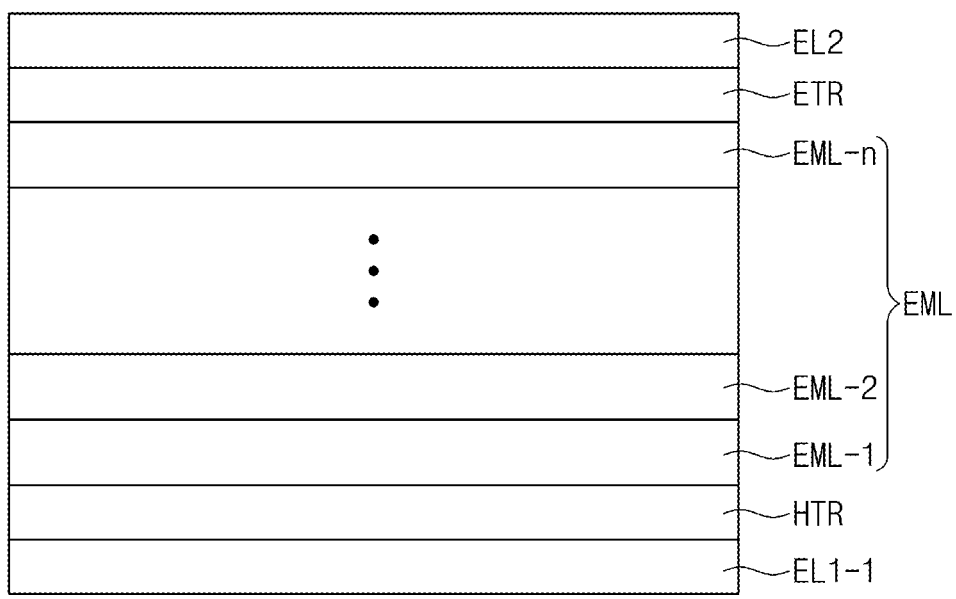
FIG. 8 is an enlarged cross-sectional view of FIG. 3 illustrating another exemplary embodiment of a portion of an emission element layer constructed according to principles of the invention.

FIG. 8 is an enlarged cross-sectional view of FIG. 3 illustrating another exemplary embodiment of a portion of an emission element layer constructed according to principles of the invention. Referring to FIG. 8, the emission element LED-1 may include a plurality of emission layers EML-1, EML-2, . . . , and EML-n. The emission layers EML-1, EML-2, . . . , and EML-n may be sequentially stacked in a thickness direction of the emission element LED-1. The emission layers EML-1, EML-2, . . . , and EML-n may be configured to emit lights of different peak wavelengths. For example, the emission layers EML-1, EML-2, . . . , and EML-n may be configured to emit blue lights, but center values of peak wavelengths of the blue lights emitted from the emission layers EML-1, EML-2, . . . , and EML-n may be different from each other.

The emission element layer LED may be a tandem structure including a plurality of light-emitting units. For example, the emission element layer LED may include a plurality of light-emitting units, each of which includes the hole transport region HTR, the emission layer EML, and the electron transport region ETR. As an example, the emission element layer LED (e.g., see FIG. 2) may include a plurality of light-emitting units stacked in a thickness direction of the emission element layer LED. The light-emitting units may be configured to emit light of the same color or to emit lights of different peak wavelengths or colors.

In the case where, as shown in FIG. 8, a plurality of emission layers EML-1, EML-2, . . . , and EML-n are provided, the first light emitted from the emission element layer LED (e.g., see FIG. 2) may have an increased full width half maximum (FWHM). This may lead to an increase in wavelength range of the first light passing through the second or third light control unit CCP2 or CCP3 (e.g., see FIG. 2), without conversion to the second or third light. In this case, the color purity characteristics of the display device may be deteriorated by a light leakage phenomenon. By contrast, according to the principles and exemplary embodiments of the invention, since the filter layer CFL contains the photochromic compound, it may be possible to block light in a wide wavelength region and thereby improve the color purity characteristics, compared with a color filter layer containing a pigment or a dye of absorbing light in a specific wavelength region.

According to the principles and some exemplary embodiments of the invention, the display panel DP may include the filter layer CFL containing the photochromic compound, the emission element layer LED (e.g., see FIG. 2) emitting the first light. The photochromic compound may have a conjugation bond, which is reversibly elongated when it absorbs light in a wavelength region of the first light, and this may allow for selective transmission of light in a wavelength region of about 480 nm or longer. Thus, it may be possible to prevent or suppress light leakage from occurring in the display panel DP, and thus, the display device DS including such a display panel may be have high brightness and good color purity characteristics.

Display panels constructed according to the principles and exemplary implementations of the invention may have a filter layer including a photochromic compound, and this make it possible to suppress light leakage in the display panel. and to improve color purity characteristics of a display device including the display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
    a first layer;
    a light control member disposed on the first layer, the light control member comprising a light converting element to initiate a change in wavelength of a first light to be emitted from the first layer; and
    a filter disposed on the light control member, the filter comprising a photochromic compound having a conjugation bond reversibly elongatable by absorbable light in a wavelength region of the first light to allow selective transmission of light in a wavelength region of about 480 nm or longer.

2. The display panel of claim 1, wherein the light control member comprises a light control layer including a first light controller, a second light controller, and a third light controller, which are spaced apart from each other
    the second light controller comprises a first light converting element to convert the first light to a green light, and
    the third light controller comprises a second light converting element to convert the first light to a red light.

3. The display panel of claim 2, wherein the first layer comprises an emission element layer and the filter comprises a filter layer including:
    a first filter portion overlapped with the first light controller comprising a first light control unit; and
    a second filter portion overlapped with the second and third light controllers comprising second and third light control units,
    wherein the second filter portion comprises the photochromic compound.

4. The display panel of claim 3, wherein the second filter portion comprises:
    a first sub-filter portion overlapped with the second light control unit; and
    a second sub-filter portion overlapped with the third light control unit,
    wherein the first and second sub-filter portions are spaced apart from each other.

5. The display panel of claim 1, wherein the photochromic compound comprises at least one of spiropyran, spirooxazine, diarylethene, azobenzene, hexaarylbiimidazole, or spiroperimidine.

6. A display panel, comprising:
    a first layer to emit a first light when activated;
    a light control member disposed on the first layer, the light control member comprising a first light controller to transmit the first light, a second light controller to convert the first light to a second light, and a third light controller to convert the first light to a third light, the second and third lights having wavelengths longer than that of the first light wavelength and different from each other; and
    a filter disposed on the light control member, the filter comprising a photochromic compound,
    wherein the photochromic compound comprises a conjugation bond reversibly elongatable when absorbing light in a wavelength region of the first light, and to selectively transmit light in a wavelength region of about 480 nm or longer.

7. The display panel of claim 6, wherein the photochromic compound has a first structure having a first conjugation bond when deactivated and has a second structure having a second conjugation bond with a longer bond length than the first conjugation bond when activated.

8. The display panel of claim 7, wherein the filter comprises the photochromic compound of the first structure to transmit light in a whole visible wavelength range, and
    the filter comprising the photochromic compound of the second structure to selectively transmit light in a wavelength region of about 480 nm or longer.

9. The display panel of claim 7, wherein the second structure is made from a ring-closing reaction of a ring included in the first structure.

10. The display panel of claim 7, wherein a chemical structure of the photochromic compound is reversible between the first structure and the second structure, depending on whether or not the photochromic compound receives the first light.

11. The display panel of claim 6, wherein the photochromic compound comprises at least one of spiropyran, spirooxazine, diarylethene, azobenzene, hexaarylbiimidazole, or spiroperimidine.

12. The display panel of claim 6, wherein the filter comprises a filter member including:
    a first filter portion overlapped with the first light controller comprising a first light control unit; and
    a second filter portion overlapped with the second and third light controllers comprising second and third control units,
    wherein the second filter portion comprises the photochromic compound.

13. The display panel of claim 12, wherein the first filter portion is configured to transmit the first light, and
    the second filter portion is configured to selectively transmit light in a wavelength region of about 480 nm or longer.

14. The display panel of claim 12, wherein the second filter portion comprises:
    a first sub-filter portion overlapped with the second light control unit; and a second sub-filter portion overlapped with the third light control unit, wherein the first sub-filter portion and the second sub-filter portion are spaced apart from each other.

15. The display panel of claim 6, further comprising an upper substrate disposed on the filter.

16. The display panel of claim 6, wherein the first light is a blue light.

17. The display panel of claim 6, wherein the first layer comprises an emission element layer including a plurality of emission element layers stacked in a thickness direction.

18. A display panel, comprising:
an emission element layer to emit a first light when activated;
a light control member disposed on the emission element layer, the light control member comprising a first light controller to transmit the first light, a second light controller to convert the first light to a second light, and a third light controller to convert the first light to a third light, the second and third lights having wavelengths longer than that of the first light wavelength and different from each other; and
a filter disposed on the light control member, the filter comprising a photochromic compound, wherein the photochromic compound comprises:
a first photochromic compound having a first structure to transmit light in a whole visible wavelength range when deactivated, and having a second structure to block a blue light and to transmit a green light when activated; and
a second photochromic compound having a third structure to transmit light in the whole visible wavelength range when deactivated and having a fourth structure to block the blue light and to transmit a red light when activated.

19. The display panel of claim 18, wherein the filter comprises a filter layer including:
a first filter portion overlapped with the first light controller comprising a first light control unit to transmit a first light;
a second filter portion overlapped with the second light controller comprising a second light control unit, the second filter portion comprising the first photochromic compound; and
a third filter portion overlapped with the third light controller comprising a third light control unit, the third filter portion comprising the second photochromic compound,
wherein the first to third filter portions are spaced apart from each other.

20. The display panel of claim 18, wherein the photochromic compound comprises at least one of spiropyran, spirooxazine, diarylethene, azobenzene, hexaarylbiimidazole, or spiroperimidine.

* * * * *